(12) United States Patent
Assaderaghi et al.

(10) Patent No.: US 6,777,304 B2
(45) Date of Patent: Aug. 17, 2004

(54) METHOD FOR PRODUCING AN INTEGRATED CIRCUIT CAPACITOR

(75) Inventors: Fariborz Assaderaghi, Mahopac, NY (US); Harold Wayne Chase, Cedar Park, TX (US); Stephen Larry Runyon, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 09/964,127

(22) Filed: Sep. 26, 2001

(65) Prior Publication Data

US 2002/0008290 A1 Jan. 24, 2002

Related U.S. Application Data

(62) Division of application No. 09/435,872, filed on Nov. 8, 1999, now Pat. No. 6,320,237.

(51) Int. Cl.[7] .............................................. H01L 21/20
(52) U.S. Cl. .................. 438/394; 438/250; 438/251; 438/252; 438/393; 438/395; 257/312; 257/313
(58) Field of Search .................................. 438/250, 251, 438/252, 393, 394, 395; 257/312, 313

(56) References Cited

U.S. PATENT DOCUMENTS

| | | | |
|---|---|---|---|
| 4,302,764 A | | 11/1981 | Fang et al. |
| 4,929,989 A | * | 5/1990 | Hayano ...................... 257/296 |
| 5,032,892 A | * | 7/1991 | Chern et al. ................ 257/532 |
| 5,266,821 A | * | 11/1993 | Chern et al. ................ 257/312 |
| 5,304,506 A | | 4/1994 | Porter et al. |
| 5,371,396 A | | 12/1994 | Vinal et al. |
| 5,525,822 A | | 6/1996 | Vinal |
| 5,576,565 A | * | 11/1996 | Yamaguchi et al. ........ 257/296 |
| 5,770,875 A | | 6/1998 | Assaderaghi et al. |
| 5,801,412 A | | 9/1998 | Tobita |
| 5,811,858 A | | 9/1998 | Ohkubo |
| 5,874,328 A | | 2/1999 | Liu et al. |
| 5,883,423 A | | 3/1999 | Patwa et al. |
| 5,965,928 A | * | 10/1999 | Nagura ....................... 257/532 |
| 6,011,285 A | | 1/2000 | Hsu et al. |
| 6,018,175 A | | 1/2000 | Kao et al. |
| 6,034,388 A | * | 3/2000 | Brown et al. ................ 257/296 |
| 6,063,659 A | | 5/2000 | Le |
| 6,096,584 A | | 8/2000 | Ellis-Monaghan et al. |
| 6,124,163 A | | 9/2000 | Shirley et al. |
| 6,146,939 A | | 11/2000 | Dasgupta |
| 6,211,546 B1 | | 4/2001 | Kato et al. |
| 2002/0008290 A1 | * | 1/2002 | Assaderaghi et al. ....... 257/403 |

* cited by examiner

*Primary Examiner*—Amir Zarabian
*Assistant Examiner*—Jeff Vockrodt
(74) *Attorney, Agent, or Firm*—Casimer K. Salys; Russell D. Culbertson; Shaffer & Culbertson, L.L.P.

(57) ABSTRACT

A capacitor structure (10) is implemented in an integrated circuit chip (11) along with other devices at the device level in the chip structure. The method of manufacturing the capacitor includes forming an elongated device body (17) on a semiconductor substrate from a first semiconductor material. Fabrication also includes forming lateral regions (20, 22) on both lateral sides of this device body (17). These lateral regions (20, 22) are formed from a second semiconductor material. A dielectric layer (28) is formed over both lateral regions (20, 22) and the device body (17), while an anode layer (30) is formed over the dielectric layer in an area defined by the device body. Each lateral region (20, 22) is coupled to ground at a first end (25) of the elongated device body (17). The anode (30) is coupled to the chip supply voltage at a second end (33) of the device body opposite to the first end. The entire structure is designed and dimensioned to form an area-efficient and high-frequency capacitor.

5 Claims, 9 Drawing Sheets

METHOD FOR PRODUCING AN INTEGRATED CIRCUIT CAPACITOR

CROSS-REFERENCE TO RELATED APPLICATIONS

The present application is a divisional of U.S. patent application Ser. No. 09/435,872, filed Nov. 8, 1999, entitled "DECOUPLING CAPACITOR STRUCTURE AND METHOD FOR MAKING AN INTEGRATED CIRCUIT CAPACITOR," now U.S. Pat. No. 6,320,237. The Applicants claim priority from this parent application under 35 U.S.C. §120. This parent application is related to the following U.S. patent applications:
(1) application Ser. No. 09/435,867, filed Nov. 8, 1999, entitled "METHOD, APPARATUS, AND PROGRAM PRODUCT FOR LAYING OUT CAPACITORS IN AN INTEGRATED CIRCUIT," and
(2) application Ser. No. 09/435,863, filed Nov. 8, 1999, entitled "ON-CHIP DECOUPLING CAPACITOR ARRANGEMENT PROVIDING SHORT CIRCUIT PROTECTION." The disclosure of the parent application and each of these related applications is incorporated herein by this reference.

TECHNICAL FIELD OF THE INVENTION

This invention relates to the fabrication of integrated circuits and, more particularly, to a method for producing a capacitor in an integrated circuit. The method according to the invention is especially suited for making a decoupling capacitor included in an integrated circuit.

BACKGROUND OF THE INVENTION

The high switching rates used in a modern integrated circuit may cause the supply voltage to degrade at certain points in the circuit and may cause circuit failures. Capacitors may be used to reduce supply voltage variations arising from high switching rates in the supplied circuits. These decoupling capacitors are connected between the supply voltage and ground in parallel with the supplied circuit. This parallel capacitance tends to decouple the voltage supply from disturbances induced by activity in the supplied circuit and allow the voltage supply to remain at the intended level.

In earlier integrated circuits, the decoupling capacitance could be placed off-chip due to the relatively slow cycle times at which the earlier circuits operated. The relatively low frequency response exhibited by these off-chip capacitor structures could still accommodate the relatively slow switching rates of the earlier circuits. In addition, the on-chip circuitry itself provided a large amount of near-by decoupling capacitance. As semiconductor fabrication technologies advance, however, circuit devices such as transistors are packed more and more densely on integrated circuit chips. At the same time, the resulting circuits operate at faster cycle times. At current cycle times on the order of 1 GHz, off-chip capacitance takes many processor cycles to respond. The slow frequency response of off-chip capacitance makes off-chip capacitor arrangements unsuitable for providing the decoupling capacitance necessary to prevent circuit failures in these faster integrated circuit devices. Further, silicon-on-insulator ("SOI") technology allows for still faster cycle times, while further reducing the capacitance of on-chip, non-switching circuitry.

In order to provide sufficient decoupling capacitance at the frequency response necessary in modern higher-frequency circuits, the capacitance must be moved closer to the switching circuitry, onto the integrated circuit chip itself. However, the on-chip capacitance must be provided in an area-efficient manner so as not to take up excessive space on the respective chip. Also, on-chip capacitors should be easy to fabricate along with the active and passive circuit elements which make up the desired integrated circuit.

SUMMARY OF THE INVENTION

It is an object of the invention to provide a method of producing a semiconductor capacitor, and particularly a semiconductor capacitor which is readily fabricated on a semiconductor chip with other circuit devices in either bulk or SOI technology. Another object of the invention is to provide a method for improving area efficiency and the frequency response from the semiconductor capacitor.

The capacitor according to the invention is implemented in an integrated circuit chip along with other devices at the device level in the chip structure. "Device level" in this sense means the level in the integrated circuit at which transistors and other circuit elements are formed. The method of producing the capacitor includes producing an elongated device body formed from a first semiconductor material. Lateral regions preferably formed from a second semiconductor material are produced on both lateral sides of the device body. The method also includes forming a dielectric layer over both lateral regions and the device body, and forming an anode layer over the dielectric layer in an area defined by the device body. The fabrication method also includes covering the entire structure with a suitable insulating material for isolation purposes. Thus, the capacitor according to the invention is produced similar to an insulated gate field effect transistor ("IGFET") with the two lateral regions analogous to the source and drain regions of the transistor structure, and the anode analogous to the gate of the transistor structure.

According to the invention, each lateral region is coupled to ground at a first end of the elongated device body. The anode layer is coupled to the chip supply voltage at a second end of the device body opposite to the first end. With the lateral regions of the structure coupled to ground and the anode coupled to the supply voltage, the capacitor device operates similarly to a IGFET in accumulation mode. Since the lateral regions, analogous to the source and drain of an IGFET, are both coupled to ground, no current flows across the device body. Rather, the device functions as a capacitor between the supply voltage and ground with a positive charge accumulating in the anode material and a negative charge accumulating in the device body material along the dielectric layer. The capacitor structure exhibits a high frequency response due to the location of the structure on-chip and due to the sizing of the device body to maintain a low effective resistance in the device body. Thus, the capacitor structure is capable of effectively decoupling the supply voltage from the effect of high frequency circuits on the chip.

The present capacitor structure may be implemented both in standard CMOS semiconductor technology (commonly referred to as "bulk" semiconductor technology), and in SOI technology. Since the capacitor devices are formed at the device level using the same manufacturing process steps with other circuit devices, the present capacitor structure may be fabricated easily along with other devices on-chip to provide effective decoupling capacitance with a high frequency response.

When implemented in bulk, the device body may be constructed in an N-well formed in a P-type material substrate. The device body may comprise a region relatively heavily doped with N-type impurities. Each lateral region may comprise a more heavily doped N-type material. The dielectric layer may comprise a thin layer of silicon dioxide while the anode layer may comprise a suitable metal or preferably polycrystalline silicon.

When implemented in SOI technology the device body is formed above a buried oxide layer and may comprise an N-type semiconductor material. Each lateral region may comprise an $N^+$ material. As in the bulk implementation, the dielectric material may comprise a thin layer of silicon dioxide deposited over both lateral regions and the device body. The anode of either metal or polycrystalline silicon is formed over the dielectric layer and the entire device is isolated further by a suitable insulating material.

In the case of either bulk or SOI implementation, the invention preferably includes forming a first end region from the same semiconductor material as the lateral regions. This first end region extends along a first end of the device body and contacts each lateral region at the first end of the device body. The invention includes coupling the first end region to ground preferably with one or more very low resistance contacts to a wiring layer in the chip structure. The supply voltage connection to the anode layer is also made with one or more very low resistance contacts. Contacts to the anode preferably meet the anode at a second end of the device body and extend upwardly to a wiring layer of the chip structure.

These and other objects, advantages, and features of the invention will be apparent from the following description of the preferred embodiments, considered along with the accompanying drawings.

DESCRIPTION OF THE PREFERRED EMBODIMENTS

FIGS. 1 through 5 show a capacitor structure 10 embodying the principles of the invention implemented in a bulk semiconductor integrated circuit chip 11. FIGS. 6 through 9 show a capacitor structure 12 according to the invention implemented in an SOI integrated circuit chip 14. It will be appreciated that the views shown in the figures are representational views which show the basic relationship between the various elements of the respective capacitor structure. The semiconductor regions and layers and the other components of the structure are shown in greatly exaggerated scale. Also, in an actual device, boundary lines between materials in the structure may not form straight lines as depicted for purposes of illustration in the figures. The relationships between the various materials shown in the figures are intended to clearly illustrate the invention without obscuring the invention in unnecessary detail.

Figure 1:
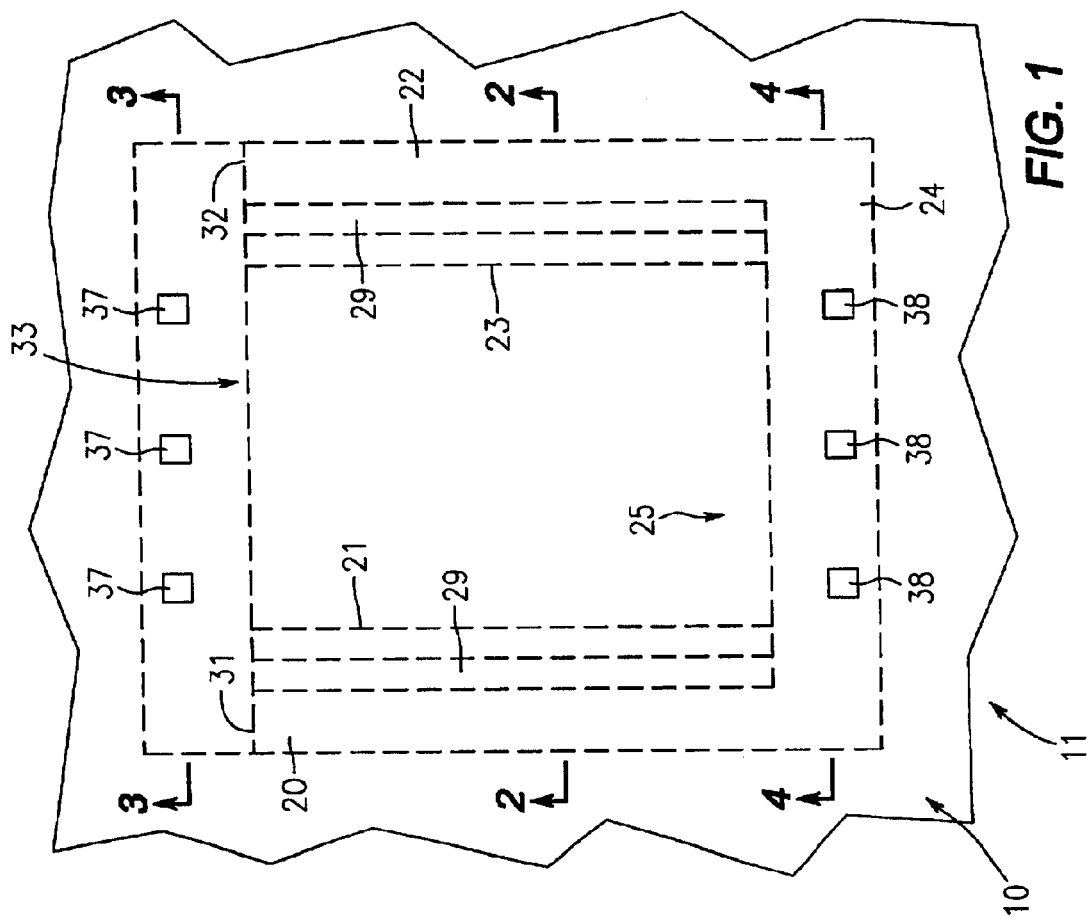
FIG. 1 is a plan view of a single, bulk semiconductor capacitor structure embodying the principles of the invention as seen from a level above the level of the anode layer.
Figure 2:
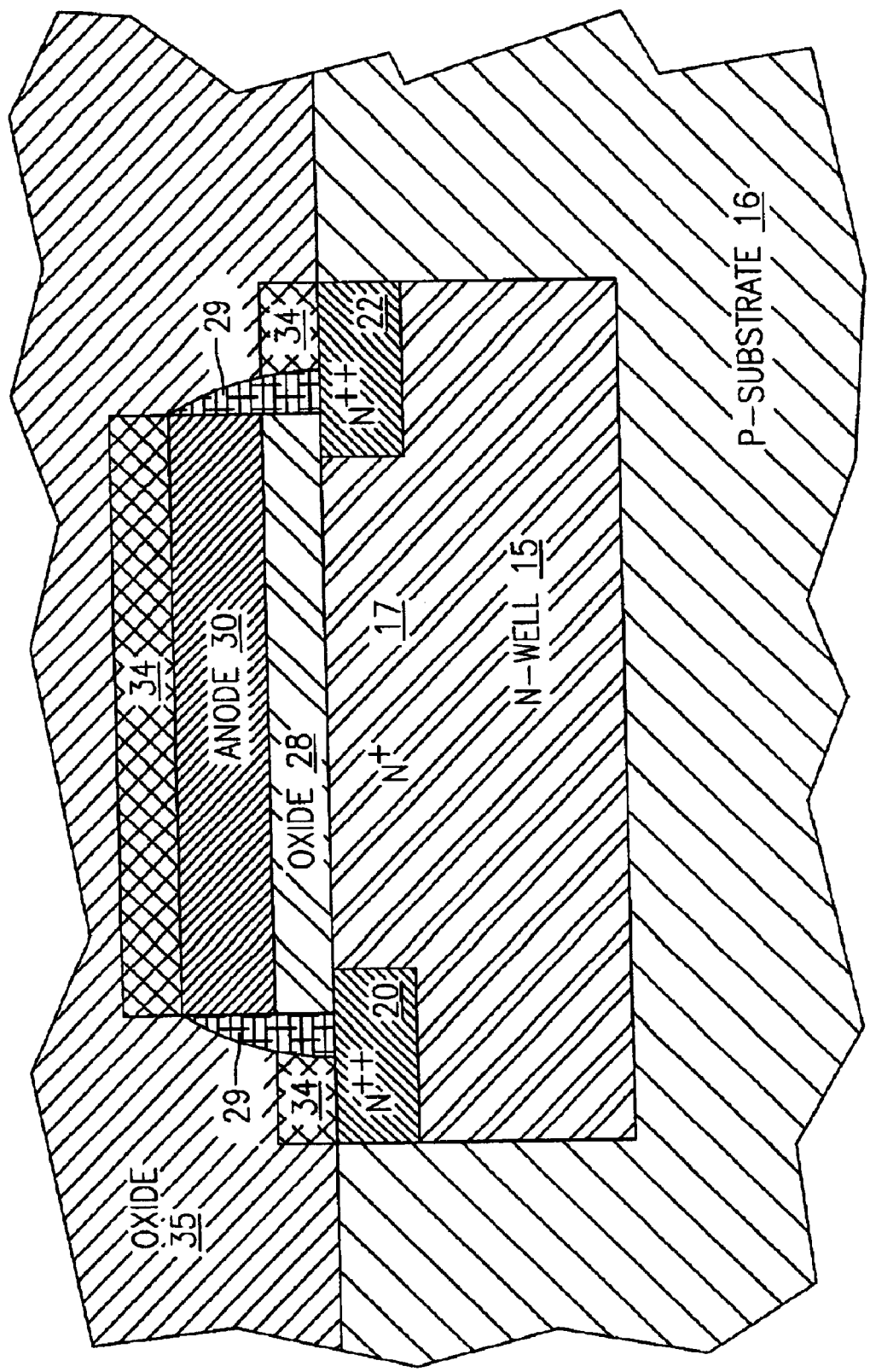
FIG. 2 is a representational view in section taken along line 2—2 in FIG. 1.

Referring to FIGS. 1 and 2, the bulk semiconductor capacitor 10 is formed in an N-well 15 which is itself formed in P-type substrate material 16. A body 17 of the capacitor comprises either the N-well material shown in the figure as $N^+$ material, or an even more heavily doped N-type material as will be discussed below with respect to fabrication of capacitor 10. This device body material is labeled in the figures as $N^+$ material to indicate the relative doping level.

Lateral regions are formed along both lateral sides of device body 17. A first lateral region 20 is formed along a first lateral side 21 of device body 17 while a second lateral region 22 is formed along a second lateral side 23. These first and second lateral regions 20 and 22 are doped with N impurities more heavily than the $N^+$ material which forms device body 17. This more heavily doped N-type material is referred to in the figures as $N^{++}$ material to indicate the concentration of N-type impurities relative to the device body material. It will be noted that the specific level of impurity comprising $N^+$ material and $N^{++}$ material will coincide with the levels of impurities used in transistor devices included in chip 11.

Figure 4:
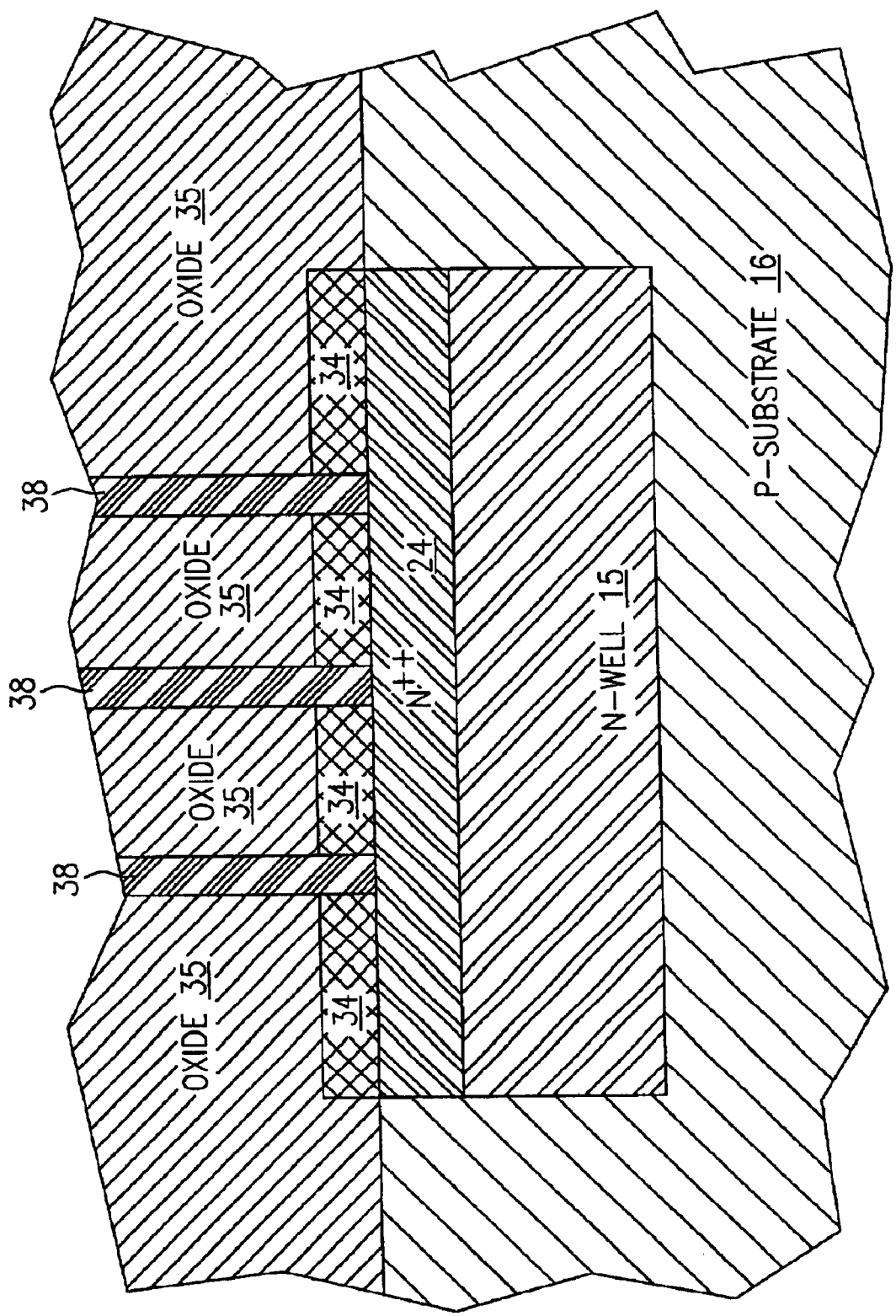
FIG. 4 is a representational view in section taken along line 4—4 in FIG. 1.

As shown in FIGS. 1 and 4, bulk semiconductor capacitor 10 also preferably includes a first end region 24 at a first longitudinal end 25 of device body 17. First end region 24 is preferably formed from the same $N^{++}$ semiconductor material which forms lateral regions 20 and 22. Thus, end region 24 together with first and second lateral regions 20 and 22 form generally a continuous U-shaped region as shown in the plan view of FIG. 1. As will be discussed with reference to FIG. 4 below, first end region 24 provides a location for coupling or electrically connecting first and second lateral regions 20 and 22 to a first supply voltage potential, in this case ground.

Referring back to FIG. 2, a dielectric layer 28 is formed over the upper surface of device body 17. This dielectric layer 28 may comprise silicon dioxide at a thickness as small as possible in the fabrication process.

An anode or electrode layer 30 is formed over dielectric layer 28. Anode layer 30 preferably extends over the entire area defined by the upper surface of device body 17. This anode layer 30 may comprise a metal, but is preferably made of polycrystalline silicon. As shown particularly in FIG. 1, anode layer 30 also extends past the end 31 of first lateral region 20 and the end 32 of second lateral region 22 at a second longitudinal end 33 of device body 17. As will be discussed below with reference to FIG. 3, this area of anode 30 at the second end 33 of device body 17 provides a preferred location for coupling the anode to a second supply voltage potential, in this case circuit supply voltage $V_{dd}$.

Figure 3:
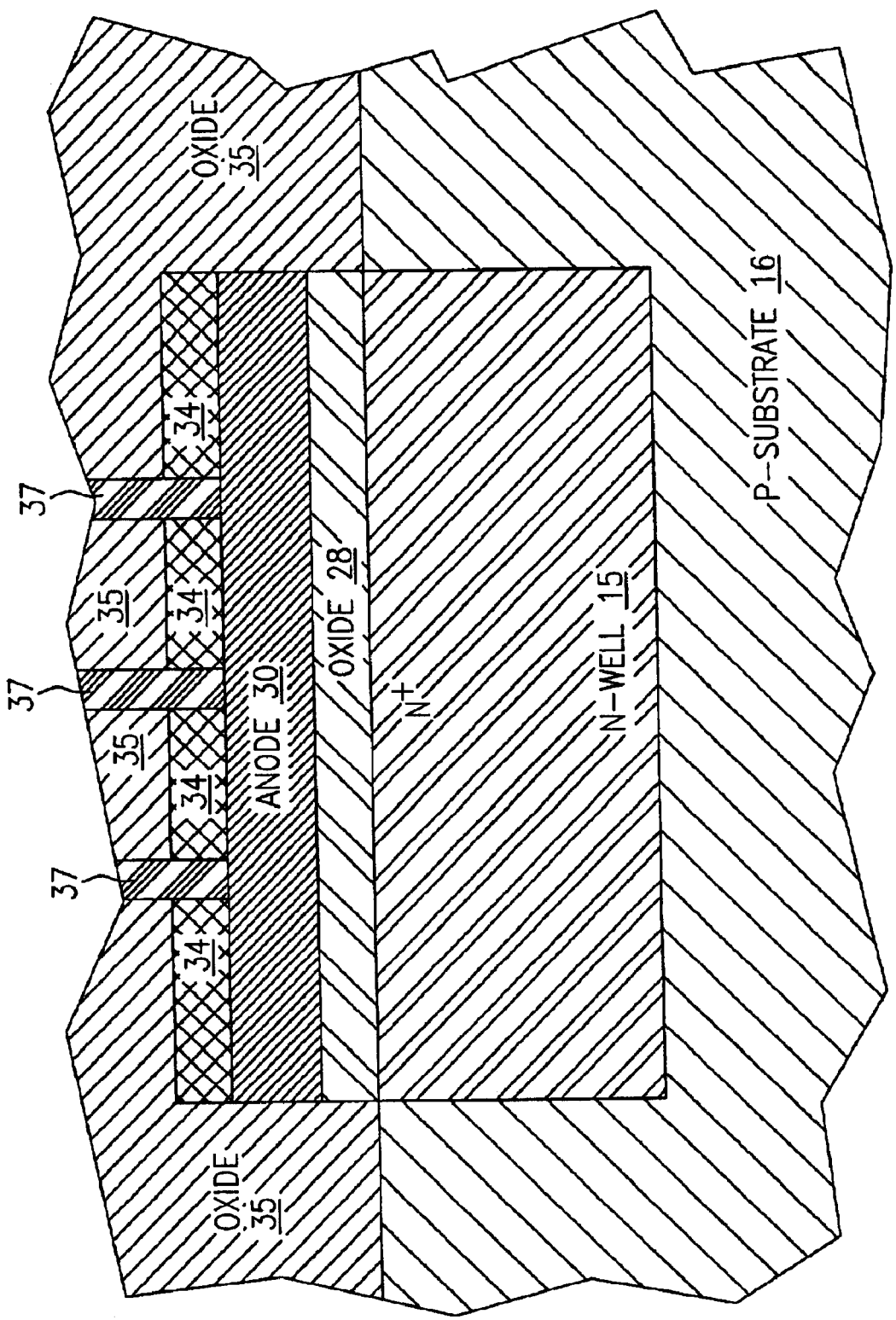
FIG. 3 is a representational view in section taken along line 3—3 in FIG. 1.

As indicated in FIGS. 2, 3, and 4, an insulating sidewall spacer 29 is deposited on the lateral sides of anode 30, and an electrically conductive layer of silicide 34 is formed over the top of the anode and the remainder of the exposed area of N-well 15. An insulator material 35 is formed over the top of silicide layer 34 and the remainder of capacitor 10 to isolate the capacitor structure generally from chip wiring layers (not shown) which are located above the device level in the chip structure. Referring to FIG. 3, conductor contacts 37 are formed through insulator layer 35 beyond the second end 33 of device body 17. Contacts 37 extend upwardly to a chip wiring layer (not shown) which is connected to the chip supply voltage $V_{dd}$. The contacts 37 thus couple anode 30 to the chip supply voltage. It will be noted that the supply voltage connection is only at the second end 33 of device body 17.

As shown in FIG. 4, contacts 38 are also formed through the insulator layer 35 to make contact with first end region 24 located at first end 25 of device body 17. Contacts 38 extend upwardly to a chip wiring layer (not shown) which is connected to ground. Thus, contacts 38 serve to couple end region 24 and lateral regions 20 and 22 to ground.

Figure 5:
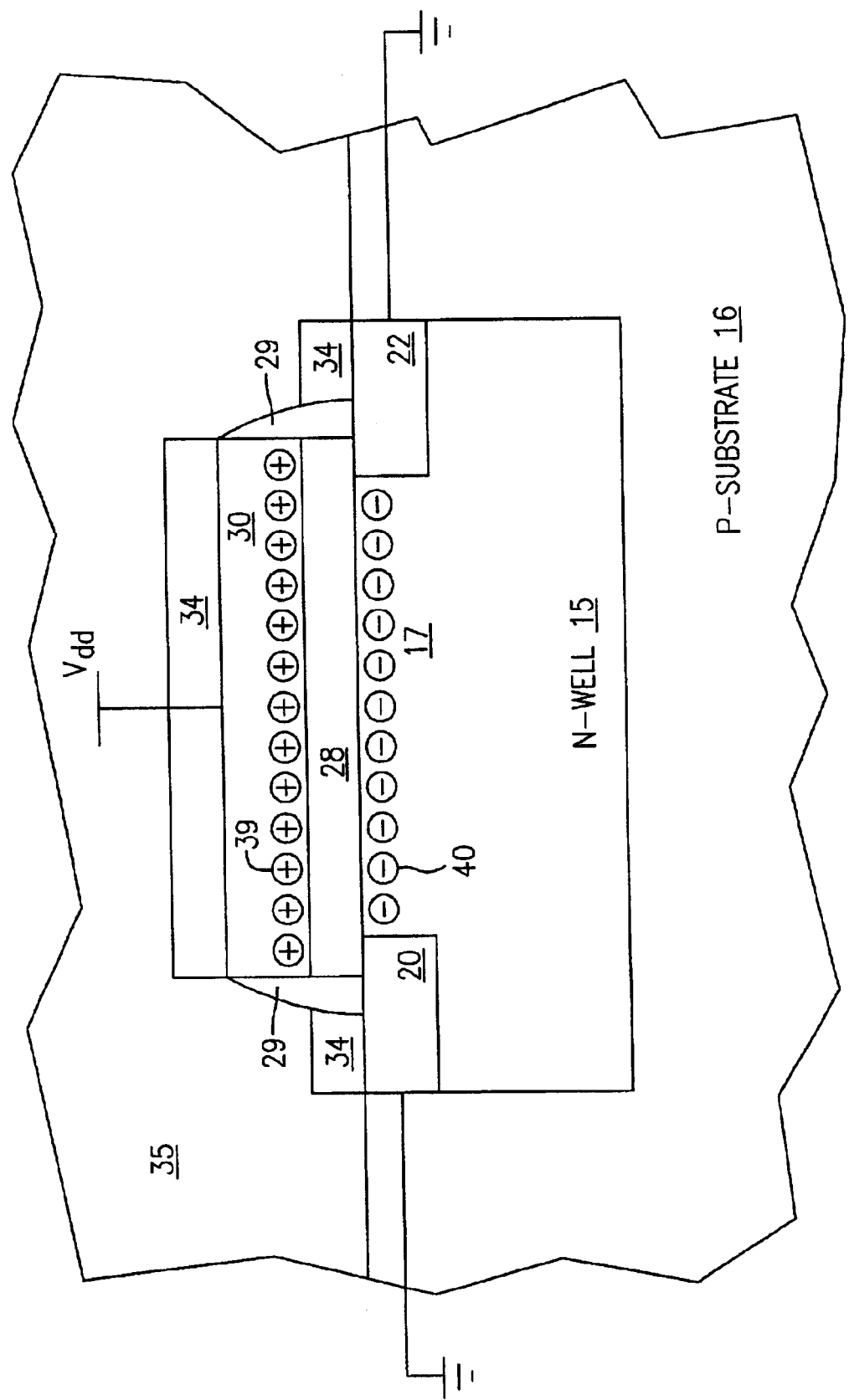
FIG. 5 is a representational view similar to FIG. 2, but showing the charge carrier accumulations resulting in the capacitor structure.

The operation of capacitor device 10 may be described with reference to FIG. 5. FIG. 5 shows a representational section view similar to FIG. 2, but with section lines removed to show the concentration of charge carriers which develops in the capacitor structure 10. With anode 30 coupled to the supply voltage $V_{dd}$, positive charge carriers or holes 39 collect in the anode material along the boundary between anode 30 and dielectric layer 28. With device body 17 coupled to ground through first end region 24 and lateral regions 20 and 22, free electrons concentrate in the device body material along the boundary of the device body and dielectric layer 28. Thus, the entire device 10 operates in the accumulation mode and anode 30 forms one plate for the capacitor while device body 17 forms the opposite plate, the two plates being separated and electrically isolated from one another by dielectric layer 28.

One important advantage of the capacitor structure 10 according to the invention relates to fabrication. Each fabrication step employed to produce the various bodies of material included in capacitor structure 10 is also employed to produce portions of other devices elsewhere in integrated circuit chip 11. Thus, capacitor structures 10 according to the invention may be produced as an adjunct to the production of the various devices included in the integrated circuit without requiring additional fabrication steps. Fabrication of the capacitor structure 10, therefore, incurs essentially no additional process cost. This advantage of the present capacitor structure applies to both the bulk semiconductor and SOI implementations. However, an additional masking and implantation step may be performed to reduce the resistivity of the device body in both bulk and SOI structures. This reduced resistivity in the device body improves frequency response and is particularly helpful in the SOI embodiment.

The fabrication steps for producing bulk capacitor structure 10 illustrated in FIGS. 1 through 5 includes first implanting N-well structure 15. This step corresponds to the N-well formation step used elsewhere in the chip for various devices, and comprises masking areas other than the desired N-well areas and implanting N-type dopant material by a suitable method. As shown particularly in FIG. 2, the device body 17 comprises a portion of this N-well, N⁺ material. Similarly formed N-well material makes up P-type transistor bodies (first type transistor bodies elsewhere on the chip. In alternate forms of the invention, an additional mask and implantation step may be performed just for the area in which each device body 17 will reside. This additional mask/implant step may be performed either immediately before or after the step of producing the N-wells and comprises implanting further N-type impurities in areas which will form a device body 17. Although this additional mask/implantation step reduces the resistivity of the device body 17 and thereby increases the frequency response of the capacitor structure 10 and allows improved area efficiency, the step represents an additional fabrication step for the chip 11.

With N-well 15 and device body 17 formed, the fabrication method next includes applying thin dielectric layer 28 and then the material for anode 30. These steps correspond to the steps of applying the gate insulation layer and gate electrode material, respectively, in transistor devices elsewhere on chip 11, and are performed concurrently with those steps. The areas other than the areas of chip 11 where lateral regions 20 and 22, and first end region 24 are to be located are then masked off and N-type impurities are implanted in the exposed areas to form these regions. This step corresponds to the step of producing the source and drain regions in N-type transistor structures at other locations on chip 11 and is performed concurrently with that step. It will be appreciated that the silicon oxide layer previously deposited over the entire chip surface preferably remains in place during the formation of lateral regions 20 and 22, and first end region 24. The N-type impurity may be driven through the thin silicon oxide layer to be implanted in the underlying N-well silicon. However, alternative fabrication arrangements may remove the thin oxide layer or perform other steps at this point such as producing lightly doped regions corresponding with the lightly doped drain regions formed in transistor structures on chip 11.

In the preferred fabrication process, the silicon oxide layer over the newly implanted lateral regions 20 and 22 and first end region 24 is next etched away and insulating side walls 29 are deposited on the lateral sides of anode 30. The thin, conductive silicide layer 34 is then deposited over the remaining area of lateral regions 20 and 22, and over end region 24 and anode 30. Finally, the entire structure is covered with insulating material 35 and the metalization process known in the art is used to produce contacts 37 and 38, and the wiring layers (not shown) to which the contacts extend.

Those skilled in the art will appreciate that the fabrication steps set out above are described solely for purposes of example, and are not intended to limit the scope of the invention. Numerous semiconductor fabrication processes may be used to produce a capacitor structure embodying the principles of the invention. The process described above for the bulk semiconductor implementation is preferred because, aside from additional doping of the device body 17, each step corresponds to a step which is already required in producing integrated circuit chip 11. However, capacitor structures within the scope of the invention may be fabricated in steps entirely separate from those used in producing other devices on chip 11, and using many alternate fabrication techniques.

Figure 6:
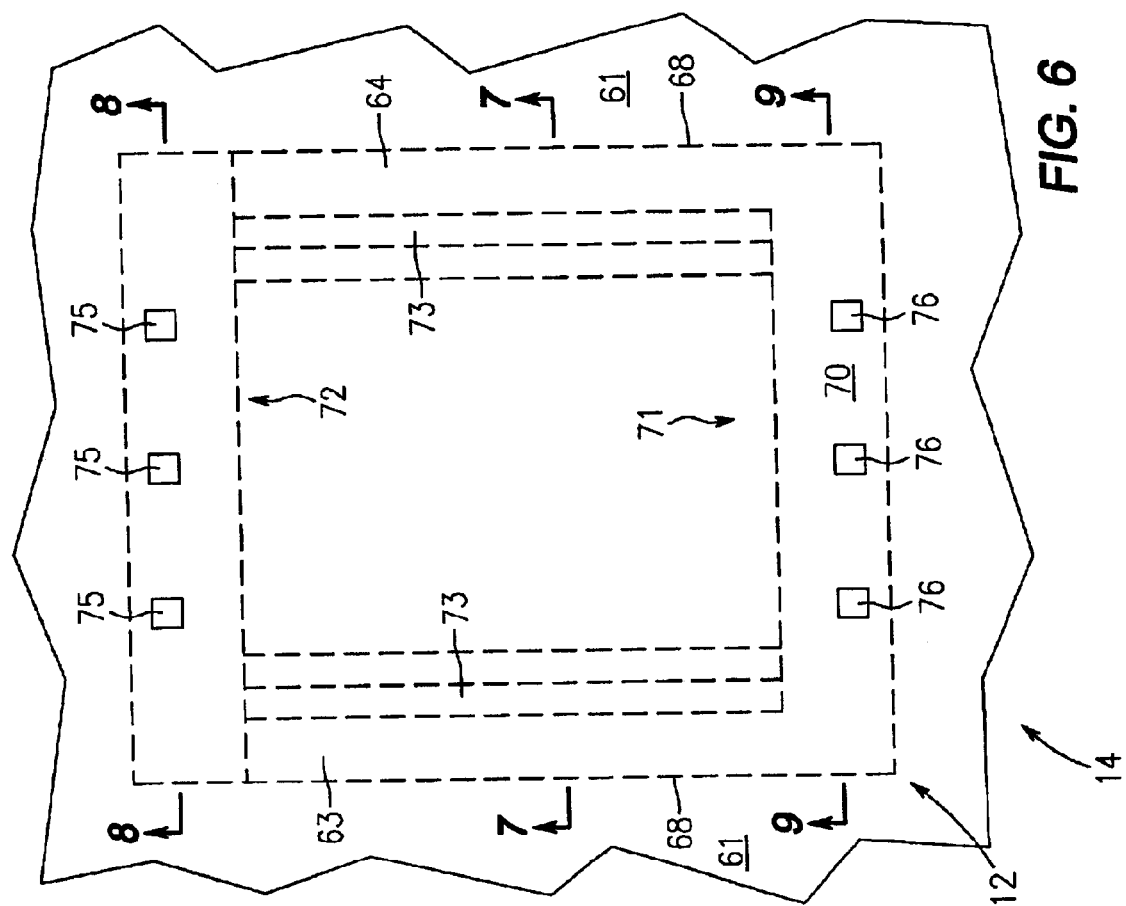
FIG. 6 is a plan view of a single, SOI semiconductor capacitor structure embodying the principles of the invention as seen from a level above the level of the anode layer.
Figure 7:
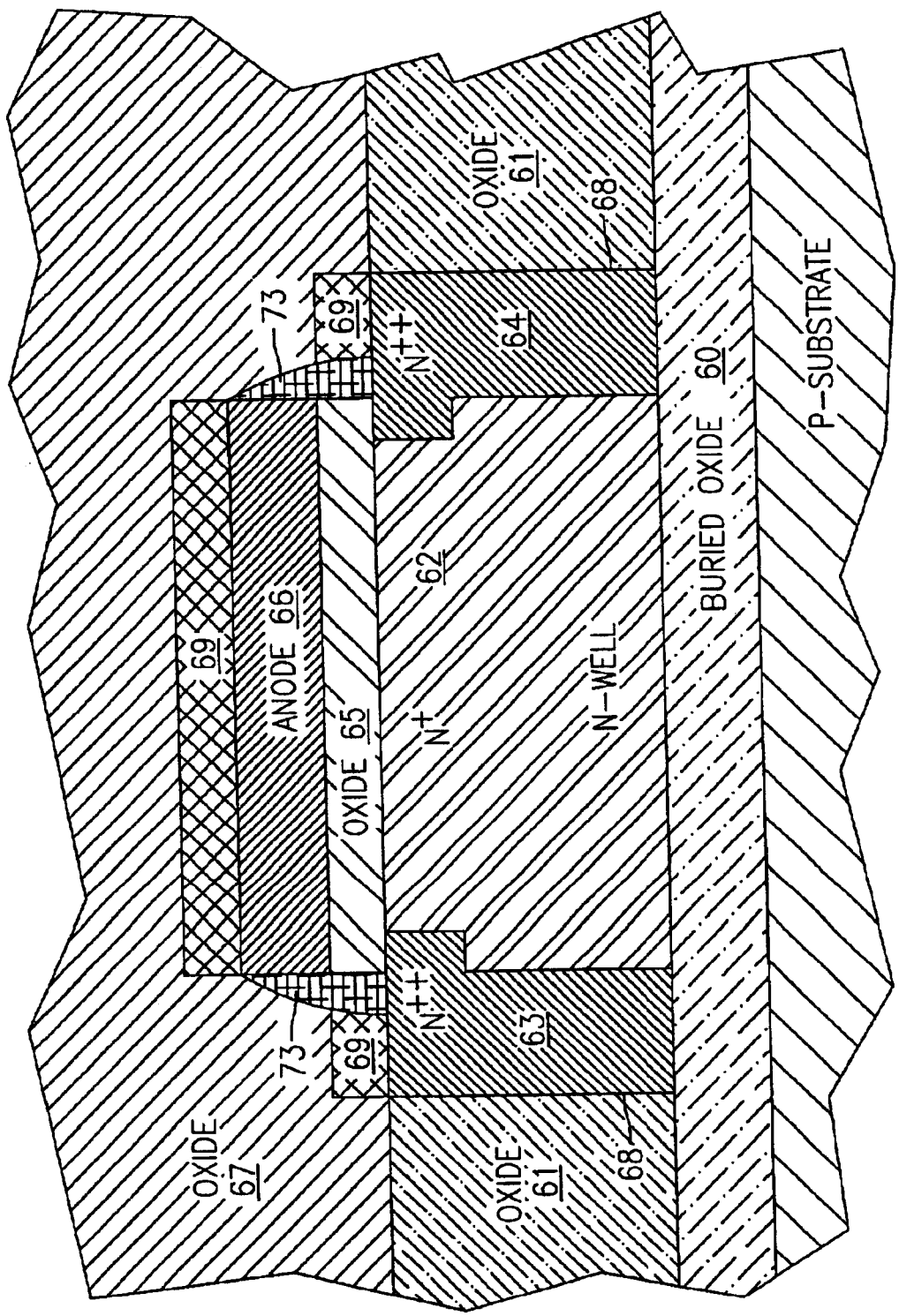
FIG. 7 is a representational view in section taken along line 7—7 in FIG. 6.
Figure 8:
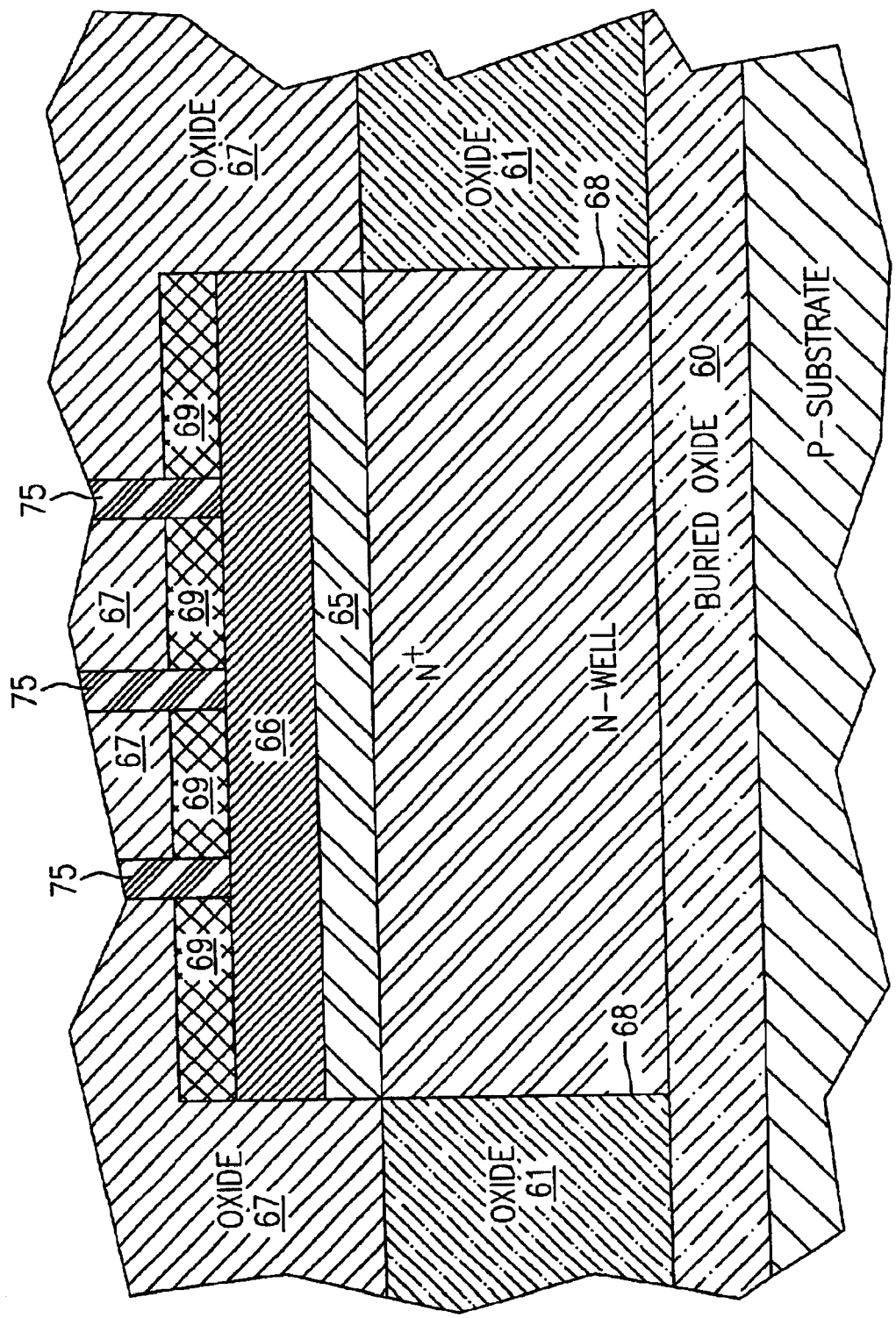
FIG. 8 is a representational view in section taken along line 8—8 in FIG. 6.
Figure 9:
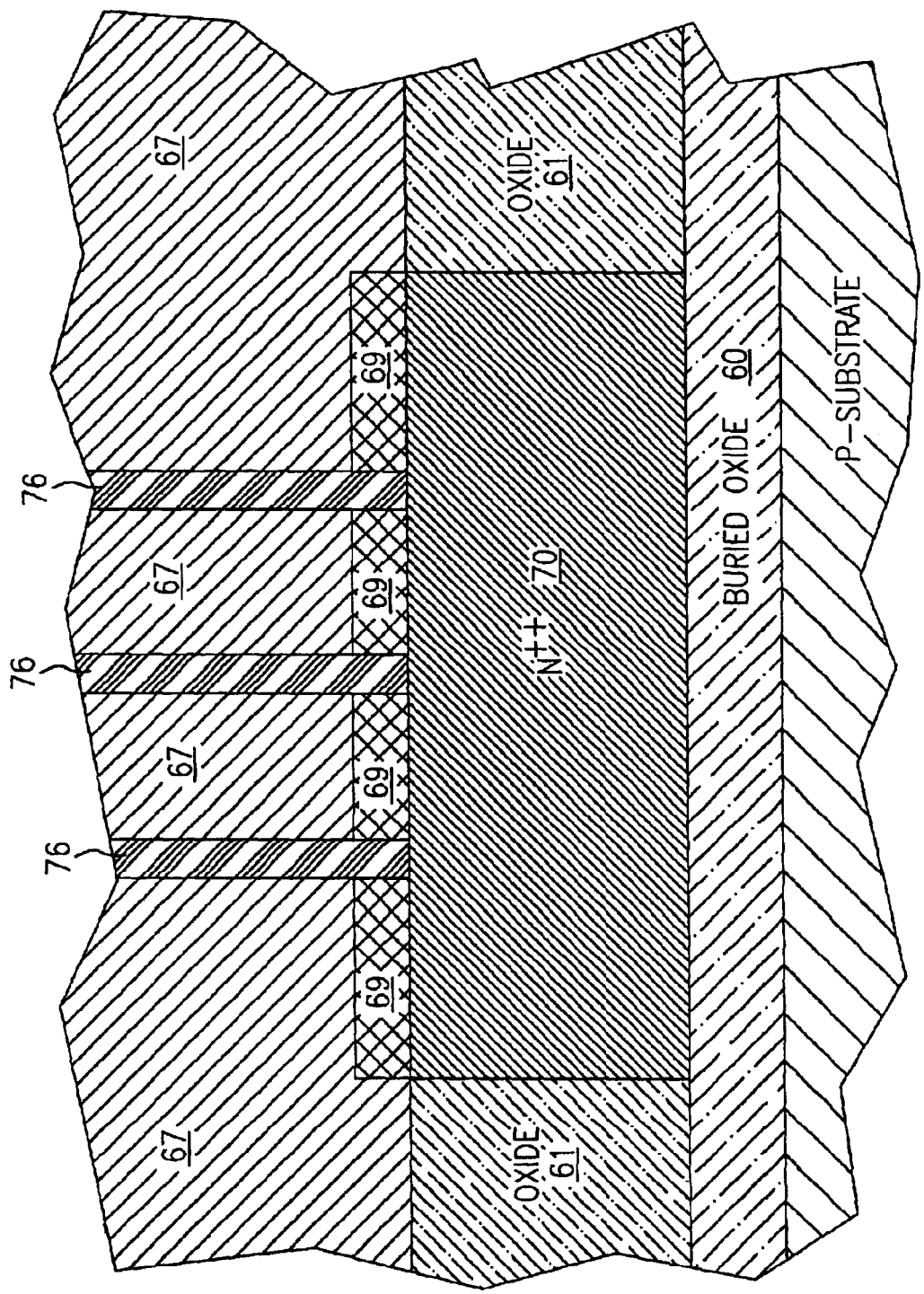
FIG. 9 is a representational view in section taken along line 9—9 in FIG. 6.

Referring now to FIGS. 6 and 7, SOI capacitor 12 is isolated on all sides by insulator material as in all SOI devices. In particular, capacitor structure 12 is defined in an area bounded by a buried oxide layer 60 and side oxide regions 61. The capacitor structure includes a device body 62, first and second lateral regions 63 and 64 respectively, a dielectric layer 65, an anode or electrode 66 with insulator side wall regions 73, silicide layer 69, and an isolating insulator material 67. As shown particularly in FIG. 6, the plan view of SOI capacitor 12 is similar to that of the bulk capacitor 10 with the exception of the boundary 68 with side oxide region 61. Device body 62 comprises an elongated region of N-type material bounded on either lateral side by lateral regions 63 and 64. These lateral regions comprise an N⁺⁺ material. An end region 70, also an N⁺⁺ material, is formed at a first end 71 of device body 62 and electrically couples or connects the two lateral regions 63 and 64 to form generally a continuous U-shaped N$^{++}$ region. Anode 66, which may be metal or polycrystalline silicon, extends beyond the end of lateral regions 63 and 64 at a second end 72 of device body 62. As shown in FIG. 8, contacts 75 couple or electrically connect anode 66 to the supply voltage V$_{dd}$, while FIG. 9 shows contacts 76 coupling end region 70 to ground.

Anode 66 in the SOI capacitor 12 forms one plate of the capacitor structure while device body 62 forms the opposite plate. These two plates are separated and electrically isolated from one another by dielectric layer 65. With this configuration, the supply voltage V$_{dd}$ applied to anode 66 causes positive charge carriers to collect in the anode material along the boundary of the anode with dielectric layer 65. The ground connection to device body 62 through lateral regions 63 and 64 and end region 70, causes free electrons to collect in the device body material along the device body boundary with dielectric layer 65, thus placing the device in accumulation mode.

As with the bulk semiconductor fabrication steps described above, the steps used to produce the SOI embodiment 12 shown in FIGS. 6 through 9 each may correspond to the steps used in producing other SOI devices on chip 14. Starting with a P-type semiconductor wafer, the process includes first driving in buried oxide layer 60, and then producing side oxide material 61. The side oxide material 61 defines a number of locations or areas on the substrate in which devices such as a transistor or a capacitor according to the invention may be produced. The side oxide regions defining or bounding such an area or location may be thought of as a set of side oxide regions. Once this isolating oxide is in place, the fabrication includes implanting N-type impurities to produce the device body 62 material within the area bounded by buried oxide layer 60 and side oxide 61. This N-body step corresponds to an N-body producing step performed elsewhere on chip 14 for producing SOI transistors. However, this highly resistive N-body material effectively reduces the frequency response of SOI capacitor structure 12 and thus the area of device body 62 must be kept relatively small in order to provide the desired frequency response. Therefore, an additional masking and implantation step is preferably performed to introduce additional N-type impurity into the area of device body 62. This additional step may be performed either before or after the regular N-body production step and represents an additional step which has no corresponding step in SOI transistor fabrication.

Regardless of whether the additional N-body implantation step is employed to allow for larger and more area-efficient SOI capacitor structures 12, after the N-body is created, the wafer is covered with the dielectric layer 65 and then material for anode 66. This anode material is etched away in all locations except the desired anode locations, exposing the remaining dielectric material in areas where lateral regions 63 and 64, and end region 70 are to be located. The N-type dopant material is then driven into the exposed areas and through the dielectric material to form those regions. These steps correspond to the steps used to produce the source and drain regions in SOI transistor structures elsewhere on chip, and may further include tuning steps such as steps to produce lightly doped drain regions in transistors residing on SOI chip 14. Similar to the bulk fabrication process described above, the dielectric material over regions 63, 64 and 70 is next removed, insulating side walls 73 are formed on lateral sides of anode 66, and the layer of silicide 69 is deposited over anode 66 and remaining exposed areas of regions 63, 64, and 70. Finally, the entire surface is covered with insulating material 67, and contacts 75 and 76 and the wiring layers (not shown) are produced in metalization steps known in the art.

For both bulk and SOI versions of the present capacitor structure, the device body length, that is, the dimension of the device body between lateral regions, is tuned to provide the desired frequency response while still maintaining the best possible area efficiency. Where the device body length is too large, areas of capacitance near the middle of the device body will be "shielded" by the device body material resistance, creating a large RC time constant and effectively lowering the frequency response of the capacitor structure. Where the device body length is made shorter than that needed for a desired frequency response, the area-efficiency of the device will be reduced due to the resulting unnecessary lateral regions.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. A method of forming a capacitor on a semiconductor substrate together with an integrated circuit comprising a plurality of first type circuit devices and a plurality of second type circuit devices, the method including the steps of:

(a) concurrently forming a capacitor device body and a plurality of first type device bodies in the semiconductor substrate using a first type of dopant material, each first type device body corresponding to a respective one of the first type circuit devices;

(b) concurrently forming a dielectric layer over the capacitor device body and over each first type device body;

(c) concurrently forming an electrode layer over the dielectric layer in an area defined by an upper surface of the capacitor device body and in each respective area defined by an upper surface of each respective first type device body;

(d) forming a first lateral region and a second lateral region in the semiconductor substrate along opposite lateral sides of the capacitor device body and concurrently forming a respective drain region and a respective source region in the semiconductor substrate for a number of the second type circuit devices, the first lateral region and second lateral region being formed using the first type of dopant material at a level relatively higher than is characteristic of the capacitor device body;

(e) forming an insulating layer over the electrode layer, first lateral region, second lateral region, each respective drain region, and each respective source region;

(f) electrically connecting the first and second lateral regions to a first supply voltage potential at a first longitudinal end of the capacitor device body;

(g) electrically connecting the electrode layer situated over the upper surface of the capacitor device body to a second supply voltage potential at a second longitudinal end of the capacitor device body opposite to the first longitudinal end of the capacitor device body;

(h) forming a buried oxide layer in the semiconductor substrate, the buried oxide layer being formed in an area for the capacitor and in a respective area for each respective circuit device;

(i) forming a first set of side oxide regions in the semiconductor substrate for the capacitor, the first set of side oxide regions bounding the area for the capacitor;

(j) forming a respective additional set of side oxide regions in the semiconductor substrate for each respective circuit device, the respective additional set of side oxide regions bounding the area for the respective circuit device; and (k) wherein the steps of forming the buried oxide layer and each set of side oxide regions are performed prior to forming the capacitor device body and each first type device body.

2. The method of claim 1 wherein the step of forming the first lateral region, second lateral region, each drain region, and each source region also includes concurrently forming a first end region in the semiconductor substrate abutting the first longitudinal end of the capacitor device body and contacting the first and second lateral regions adjacent to the first longitudinal end of the capacitor device body.

3. The method of claim 1 wherein the first type of dopant material comprises N-type material and the step of forming the capacitor device body and each first type device body includes implanting the N-type material in the areas of the semiconductor substrate defined within each respective set of side oxide regions corresponding to the capacitor device body and each first type device body.

4. The method of claim 3 wherein the step of forming the first lateral region and second lateral region comprises implanting additional N-type material in areas defined between lateral sides of the capacitor device body and the first set of side oxide regions, and wherein the step of forming each drain region and each source region comprises implanting additional N-type material for the respective second type circuit devices.

5. A method for improving the frequency response of a decoupling capacitor in an integrated circuit, the decoupling capacitor including a device body analogous to the device body of a first type of transistor included in the integrated circuit and being formed using a first type impurity material, the decoupling capacitor further including first and second lateral regions analogous to the source and drain regions of a second type of transistor included in the integrated circuit chip, the method comprising the step of:

(a) adding additional first type impurity material to an area in the substrate for the decoupling capacitor device body located above a buried oxide layer of a silicon-on-insulator integrated circuit, the additional first type impurity material resulting in a region on the substrate for the decoupling capacitor device body that is more highly doped than a region on the substrate for the first type of transistor device body.

* * * * *